United States Patent [19]
Nishioka

[11] Patent Number: 5,635,420
[45] Date of Patent: Jun. 3, 1997

[54] METHOD OF MAKING A SEMICONDUCTOR DEVICE HAVING A CAPACITIVE LAYER

[75] Inventor: Yasushiro Nishioka, Ibaraki, Japan

[73] Assignee: Texas Instruments Incorporated, Dallas, Tex.

[21] Appl. No.: 485,343

[22] Filed: Jun. 7, 1995

[30] Foreign Application Priority Data

Jun. 29, 1994 [JP] Japan ................... 6-148046

[51] Int. Cl.⁶ .................... H01L 21/70; H01L 27/00
[52] U.S. Cl. ........................................ 438/3
[58] Field of Search ....................... 437/52, 60, 919

[56] References Cited

U.S. PATENT DOCUMENTS

| | | | |
|---|---|---|---|
| 5,043,049 | 8/1991 | Takenaka | 204/192 |
| 5,081,559 | 1/1992 | Fazan et al. | 361/313 |
| 5,122,923 | 6/1992 | Matsubara et al. | 361/321 |

*Primary Examiner*—Jey Tsai
*Attorney, Agent, or Firm*—David S. Guttman; W. James Brady, III; Richard L. Donaldson

[57] ABSTRACT

A method for making ferroelectric thin film form capacitors that maintains the insulating characteristics of the thin film capacitors formed on the semiconductor devices while reducing the leakage current and ensuring a yield sufficient for applications to ULSIs such as DRAMs. A metal or oxide thereof, which contains structural elements of a metal forming the ferroelectric thin film, is formed as islands in the initial stage of formation or during the formation of a ferroelectric thin film in semiconductor devices. This suppresses the formation of columnar crystals.

5 Claims, 7 Drawing Sheets

METHOD OF MAKING A SEMICONDUCTOR DEVICE HAVING A CAPACITIVE LAYER

FIELD OF THE INVENTION

The present invention pertains to semiconductor devices and pertains in particular to a technology that is effective for application to fabrication methods and semiconductor devices that contain ferroelectric thin films that permit the leakage current to be reduced.

BACKGROUND OF THE INVENTION

As the level of integration in semiconductor devices has increased, advances have been achieved in reducing the size of their component elements. Thin films of ferroelectrics with extremely high specific dielectric constants have gained attention for application to dynamic memory DRAMs, which require especially small capacitors with a high capacitance. Publicized examples include that of P. J. Bhattacharya et al. Jpn. J. Appl. Phys. Vol. 32 1993, pp. 4103–4106.

According to the disclosure of Bhattacharya et al., when a film of Ba, SrTiO$_3$ referred to hereinafter as BST was formed on a Pt substrate, it was discovered that the crystals of the film grew in columnar fashion, making it possible to obtain a high specific dielectric constant of approximately 300. However, when these thin films were used to form capacitors, although it was possible to form capacitors with very good insulating characteristics, many of them had a high leakage current. This was not satisfactory for obtaining a yield sufficient for the mass production of VLSIs such as DRAMs. Based on a detailed study of the reasons for this, it can be surmised that a leakage current was passing through the crystal grain boundaries of the ferroelectric thin film. The objective of the present invention is to provide semiconductor devices and their fabrication method which comprise ferroelectric thin films for capacitors that make it possible to obtain a yield sufficient for applications to VLSIs.

In addition, semiconductor devices, especially DRAMs, require capacitors with small surface areas. Ferroelectric thin films consisting of Ba, SrTiO$_3$, Pb Zr, TiO$_3$, etc. which have extremely low specific dielectric constants have gained attention for use in obtaining such capacitors. When these thin films are used to form capacitors, it is possible to form capacitors with extremely good insulating characteristics. However, many of them have a high leakage current. Thus, it is not possible to obtain a yield sufficient for applications to ULSIs such as DRAMs. The objective of the present invention is to provide a charge-storage capacitor ferroelectric thin film and fabrication method with which it is possible to obtain a yield sufficient for mass production in applications to ULSIs.

SUMMARY OF THE INVENTION

A general overview of representative examples pertaining to the inventions disclosed in this application is presented below.

The present invention comprises a step wherein, either during the process of forming the ferroelectric thin film or in the initial stage of film formation, islands of a metal or an oxide thereof containing structural elements of the metal forming the ferroelectric thin film are formed to serve as cores. By suppressing the formation of columnar crystals it is possible to form dielectrics for capacitors with a low leakage current.

With the present invention described above, it is possible to minimize the leakage of the charge stored in the capacitors of DRAMs, etc. Thus, it is possible to use a longer DRAM refresh cycle than in the conventional case. In addition, because it is also possible to reduce the memory cell surface area while using the same refresh cycle as in the conventional case, it is possible to improve yield per wafer and to obtain semiconductor memory devices that are suitable for mass production.

In the figures, 1 is a silicon substrate, 2 is a silicon oxide film, 3 is a Ti film, 4 is a Pt film adhesive layer and lower electrode, 5 is a ferroelectric thin film, 6 are Ti core islands, 7 is a ferroelectric thin film BST, 8 is a Pt layer upper electrode, 9 is an amorphous ferroelectric film BST, 10 is a crystallized ferroelectric film BST, and 11 is a titanium oxide layer $TiO_2$.

DESCRIPTION OF EMBODIMENTS

Figure 1:
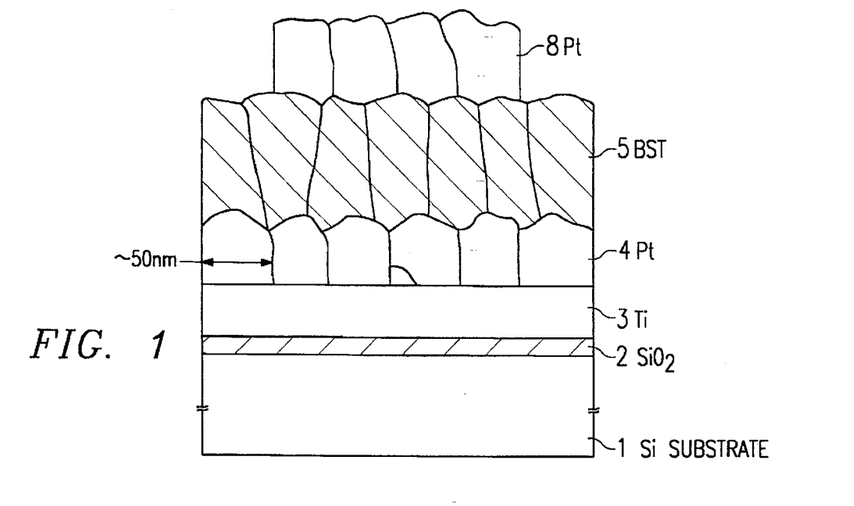
FIG. 1 is a cross section of the major components of a ferroelectric BST capacitor structure used in explaining the premises of the present invention.

The premises of the present invention will be explained with reference to FIG. 1. A silicon oxide layer 2 is formed on the surface of a monocrystalline silicon substrate 1, after which a Ti film 3 functioning as an adhesive layer is formed by sputtering to approximately 50 nm onto its [the silicon oxide layer's] surface. Next, Pt 4 with a thickness of approximately 200 nm is formed by sputtering, and a BST film 5 is deposited to a thickness of approximately 200 nm in a mixed gas atmosphere of $O_2$ and Ar using a BST ceramic target. The film formation process takes place with the substrate temperature set at approximately 650° C. to crystallize the BST film. This is because the specific dielectric constant of amorphous BST when formed at 500° C. or less is approximately 18, which is lower than the specific dielectric constant of approximately 300 in the crystallized BST. Lastly, a Pt upper electrode 8 is formed to complete the capacitors. In terms of electrical characteristics, it was learned that the leakage current of the crystalline BST film was extremely high, making applications to DRAM capacitor insulating films impractical. Based on an analysis of the BST film using a tunneling electron microscope TEM and a detailed analysis of the electrical characteristics, it was learned that there is a strong possibility that the leakage current of the BST film passes through the crystal grain boundaries of the BST film 5. In addition, the crystal grain boundaries of the BST film are columnar as shown in FIG. 1. It was learned that the size of the crystal grain boundaries is nearly the same as the size of the crystal grain boundaries of the Pt 4. Therefore, it is possible that the BST columnar crystals have characteristics that are affected by the underlying crystalline structure. Thus, the method for fabricating the capacitor dielectric film, which is an embodiment of the present invention, involves suppressing the crystal growth from the underlayer so as to reduce the leakage current of the BST film.

Figure 2:
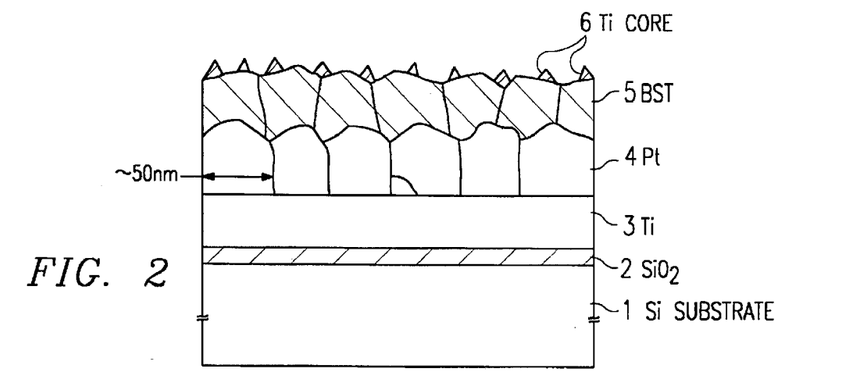
FIG. 2 is a cross section of an intermediate step for the ferroelectric BST capacitor film of the first embodiment of the present invention.

An embodiment of the present invention will be explained with reference to FIGS. 2 and 3. FIG. 2 illustrates islands of Ti deposited on the surface of a BST film. More specifically, a Ti film 3 functioning as an adhesive layer is formed by sputtering to approximately 50 nm on the surface of the silicon oxide layer 2. Next, Pt 4 with a thickness of approximately 200 nm is formed by sputtering. Next, a BST film 5 is deposited to a thickness of approximately 100 nm in a mixed gas atmosphere of $O_2$ and Ar using a BST ceramic target. The substrate temperature during this process is maintained at approximately 650° C. to crystallize the BST film 5. Next, a titanium film Ti 6 is deposited to an extremely small thickness of approximately 3 nm at 650° C. During this process an extremely large number of Ti 6 islands are formed.

Figure 3:
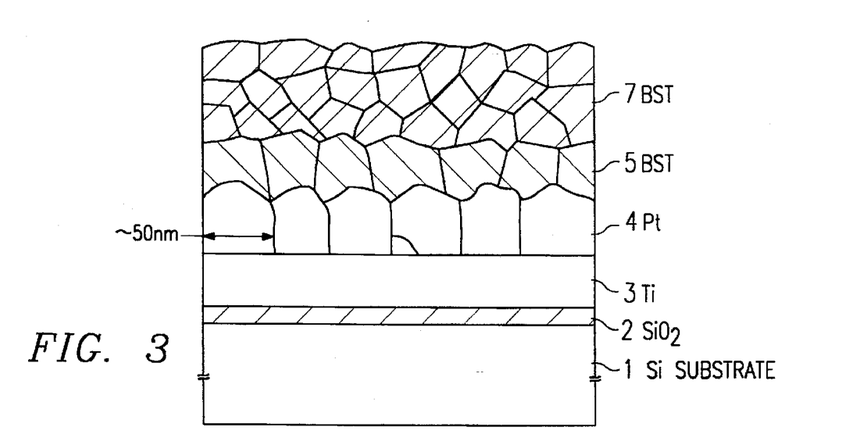
FIG. 3 is a cross section of the major components of the ferroelectric BST capacitor film of the first embodiment of the present invention.

FIG. 3 illustrates the process whereby the remaining BST film 7, which is to serve as the ferroelectric thin film, is deposited to a thickness of approximately 100 nm in a mixed gas atmosphere of $O_2$ and Ar. As shown in the figure, there is no growth of columnar crystals in the BST film. Presumably, this is due to the islands of Ti 6 that form the cores for the subsequent BST film crystal growth. Normally during the step for forming the BST film 7 at 650° C., many of the islands of Ti 6 are absorbed by one of the BST films 5 or 7, resulting in a structure such as that shown in FIG. 3. As shown in the figure, the growth of columnar crystals can be suppressed in order to form circular crystal grains. This film was used to form capacitors. An evaluation of the electrical characteristics indicated that the leakage current was significantly lower than that obtained with the conventional method, i.e., the film structured as shown in FIG. 1.

Figure 4:
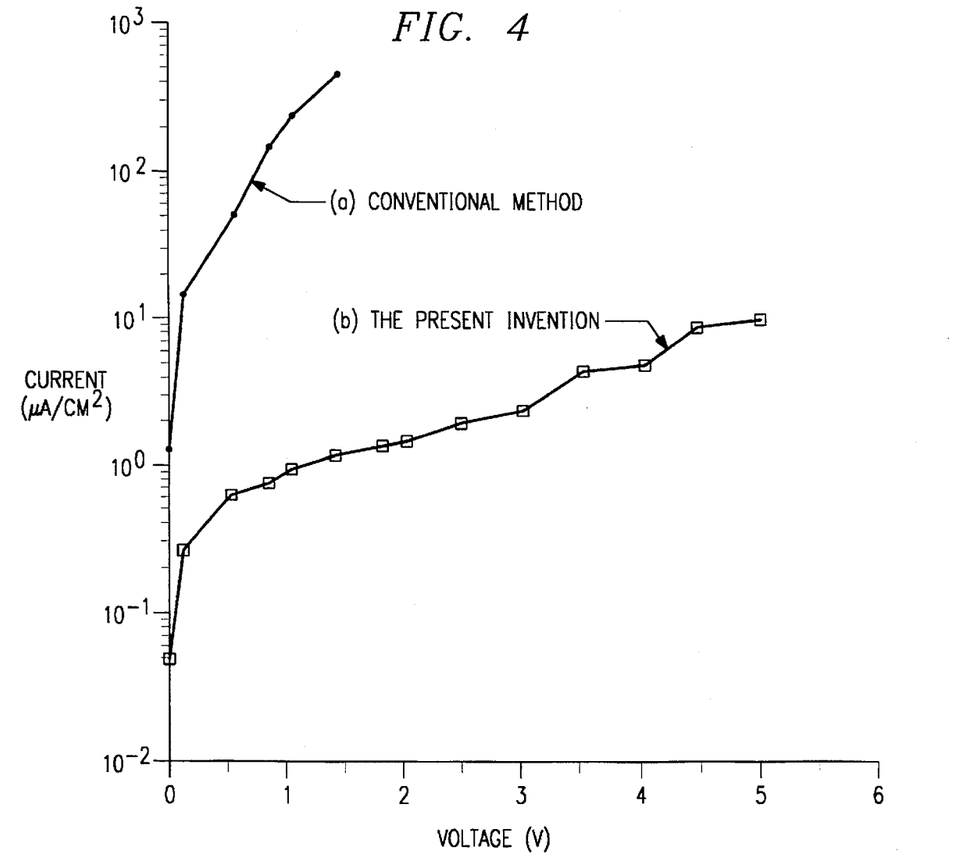
FIG. 4 is a graph of the voltage-current characteristics of the ferroelectric BST capacitor film of the first embodiment of the present invention and a capacitor obtained with a conventional method.

FIG. 4 presents a comparison of the voltage-current characteristics of the ferroelectric thin film capacitors of the present embodiment. a denotes the electrical characteristics obtained with the conventional method, and b denotes the electrical characteristics of the film obtained through the embodiment of the present invention. Specifically, the conventional film exhibited a leakage current of $4\times10^2$ $\mu A/cm^2$ at an applied voltage of 1.5 volts, whereas the result for the embodiment of the present invention was much less—1 $\mu A/cm^2$ at the same applied voltage.

Figure 5:
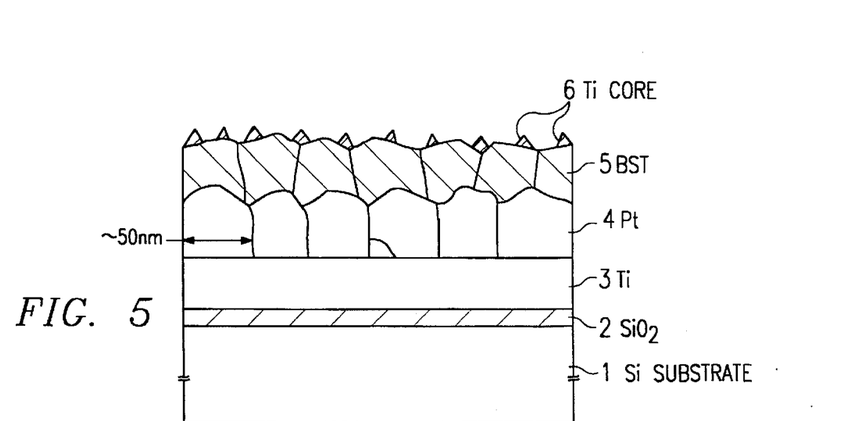
FIG. 5 is a cross section of an intermediate step for the ferroelectric BST capacitor film of another embodiment of the present invention.
Figure 6:
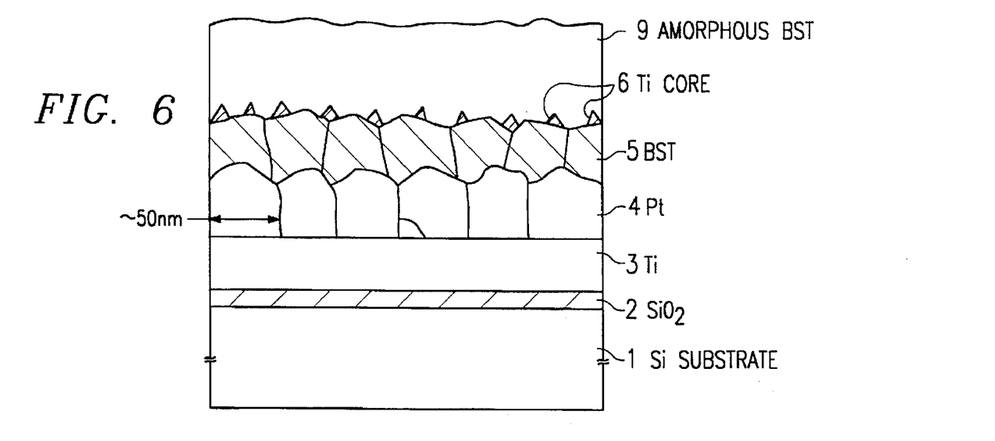
FIG. 6 is a cross section of an intermediate step for the ferroelectric BST capacitor film of another embodiment of the present invention.
Figure 7:
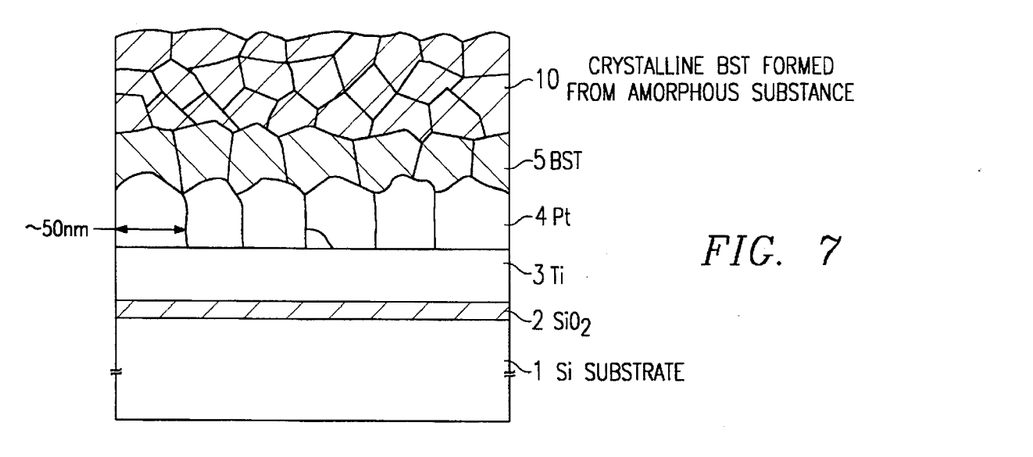
FIG. 7 is a cross section of the major components of the ferroelectric BST capacitor film of another embodiment of the present invention.

FIGS. 5 through 7 illustrate another embodiment of the present invention. In the foregoing embodiment, after the formation of the islands of Ti 6, the BST film 7 was formed at the temperature where crystallization occurs—650° C. In the present embodiment, a heat treatment is performed after first forming the BST film in an amorphous state. This makes it possible to form capacitors with an even lower leakage current. More specifically, a Ti film 3 functioning as an adhesive layer is formed by sputtering to approximately 50 nm on the surface of the silicon oxide layer 2. Next, a Pt 4 with a thickness of 200 nm is formed by sputtering thereon. Next, a BST film 5 is deposited to a thickness of approximately 100 nm in a mixed gas atmosphere of $O_2$ and Ar using a BST ceramic target. The substrate temperature during this process is maintained at approximately 650° C. to crystallize the BST film 5. Next, a titanium film Ti 6 is deposited to an extremely small thickness of approximately 3 nm at 650° C. During this process an extremely large number of Ti 6 islands are formed.

FIG. 6 illustrates the structure obtained when the remaining BST film 9 is deposited to a thickness of approximately 100 nm in a mixed gas atmosphere of $O_2$ and Ar at a temperature where crystallization does not occur 500° C. Next heat treatment is performed for approximately 30 min in the 650° C. oxygen atmosphere. As a result, the structure shown in FIG. 7 is obtained, in which the formed BST film 10 has smaller crystal grains than in the foregoing embodiment. It is presumed that the islands of Ti 6 form cores for the subsequent BST film crystal growth, and that crystal grains formed are formed simultaneously which are smaller than those of the crystallization step that follows the formation of the amorphous BST film. During this process the islands of Ti 6 are normally absorbed by one of the BST films 5 or 10 during the step in which the BST film 10 is heated to 650° C. The growth of columnar crystals is suppressed, enabling the formation of circular [sic; cylindrical] crystal grains. This film was used to form capacitors. An evaluation of the electrical characteristics indicated that the leakage current was significantly lower than that obtained with the conventional method.

Figure 8:
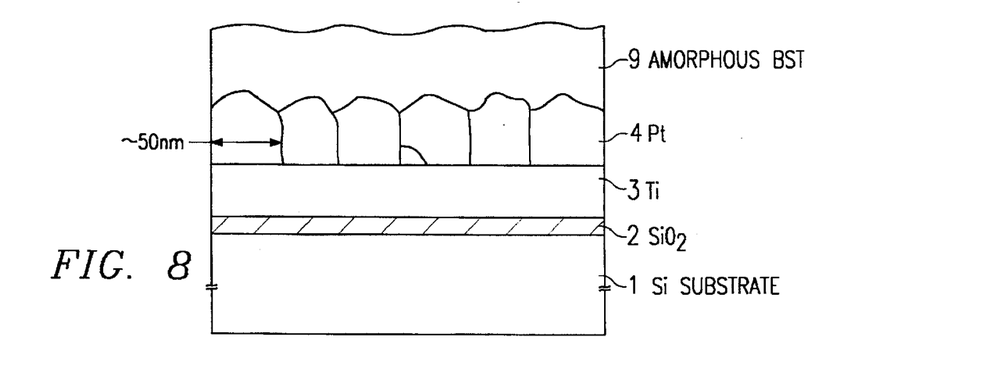
FIG. 8 is a cross section of an intermediate step for the ferroelectric BST capacitor film of another embodiment of the present invention.

FIG. 8 illustrates the structure obtained when an amorphous BST film 9 was formed to 100 nm at 500° C. on the surface of the Pt film 4 formed in the same manner as the foregoing embodiments. Another embodiment of the present invention beginning in this condition will be described with reference to FIGS. 9 and 10. In this case, it is possible to form the first-layer BST, which serves to reduce the leakage current of the BST capacitor film, from an amorphous substance.

Figure 9:
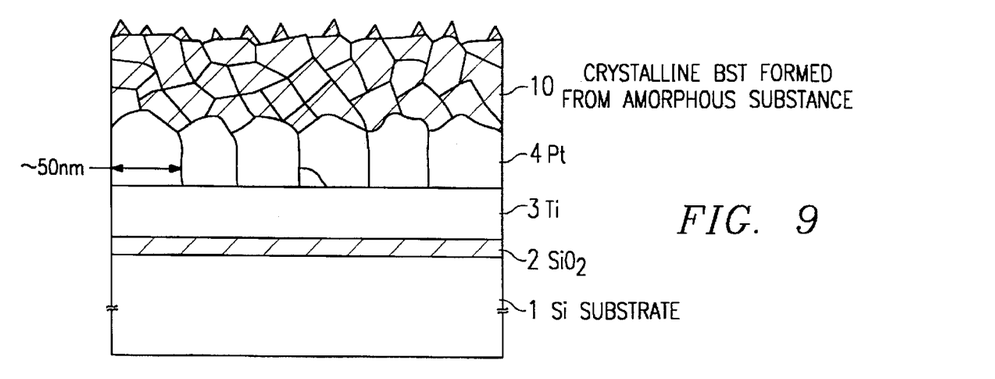
FIG. 9 is a cross section of an intermediate step for the ferroelectric BST capacitor film of another embodiment of the present invention.

FIG. 9 illustrates the structure obtained when the amorphous BST film 9 is subjected to a heat treatment in an oxygen atmosphere at 650° C. to form the crystalline BST film 10. It is clear that at this time the BST film 10 has not grown into columns and has a small crystal grain diameter. Next, islands of Ti are formed on the surface.

Figure 10:
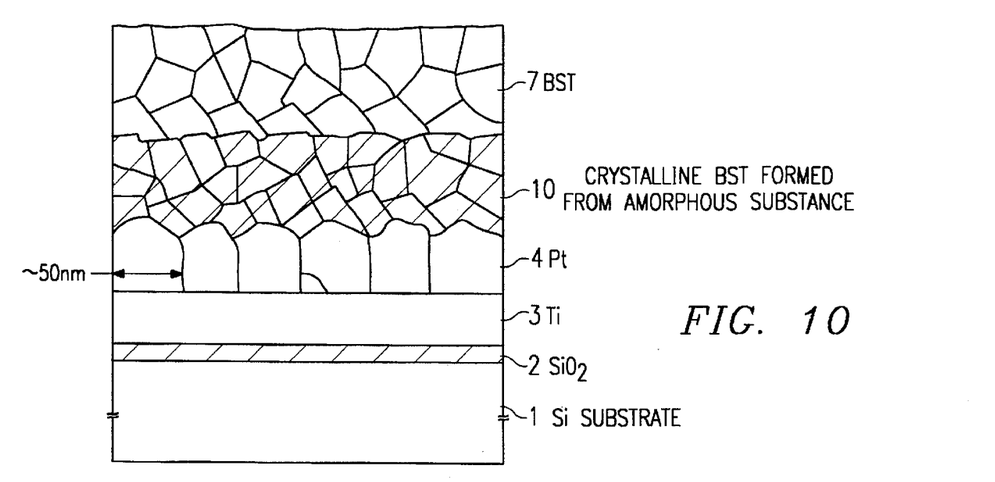
FIG. 10 is a cross section of the major components of the ferroelectric BST capacitor film of another embodiment of the present invention.

FIG. 10 illustrates the structure obtained when the second-layer BST 7 is formed at 650° C. to form BST capacitors with a small leakage current and no columnar crystals. An upper electrode was formed on top of the capacitor film to complete the capacitors.

Figure 11:
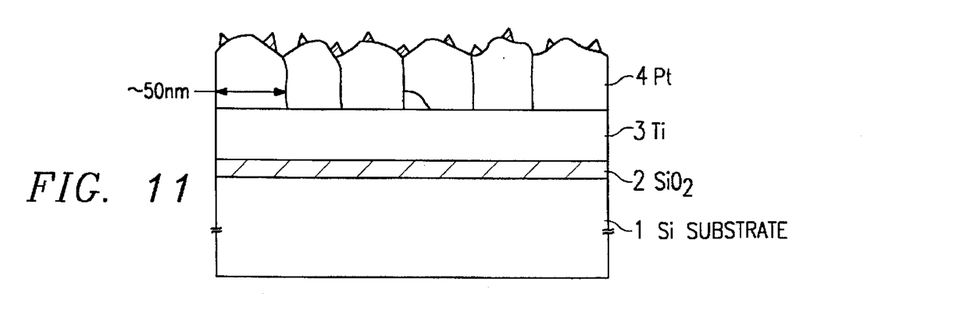
FIG. 11 is a cross section of an intermediate step for the ferroelectric BST capacitor film of another embodiment of the present invention.
Figure 12:
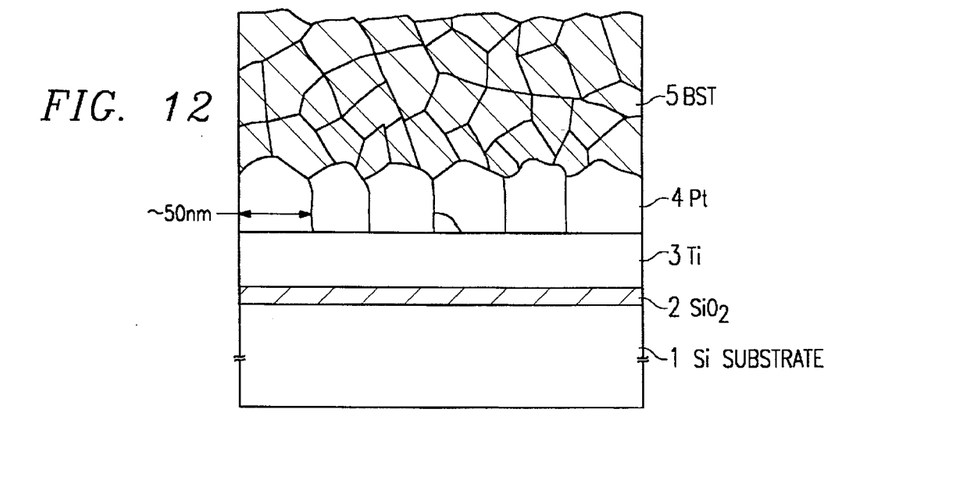
FIG. 12 is a cross section of the major components of the ferroelectric BST capacitor film of another embodiment of the present invention.

FIGS. 11 and 12 illustrate other embodiments. FIG. 11 illustrates the structure obtained when islands of the Ti film 6 are formed on the surface of an adhesive layer. More specifically, although in the foregoing embodiments islands of the Ti film 6 were introduced in an intermediate step during the ferroelectric thin film formation process in order to suppress the growth of columnar crystals, it is possible to obtain the same effects by introducing islands of the Ti film 6 prior to the formation of the ferroelectric thin film. The monocrystalline silicon substrate 1 is oxidized and the Ti film 3 functioning as an adhesive layer is formed by sputtering to approximately 50 nm on the surface of the silicon oxide layer 2. Next, Pt film 4 with a thickness of approximately 200 nm is formed by sputtering. Next, islands of the Ti film 6 are deposited to approximately 3 nm at 400° C. Next, a BST film 5 is deposited to a thickness of approximately 200 nm in a mixed gas atmosphere of $O_2$ and Ar using a BST ceramic target. The substrate temperature during this process is maintained at approximately 650° C. and the BST film 5 is crystallized in this condition to complete the formation. The islands of the Ti film 6 are absorbed by the BST film 5 in the subsequent 650° C. BST film 5 formation step. This structure is illustrated in FIG. 12. In particular, it can be seen that the growth of columnar crystals is suppressed, allowing circular crystal grains to form. This film was used to form capacitors. An evaluation of the electrical characteristics indicated that the leakage current was significantly lower than that of the structure obtained with the conventional method.

Figure 13:
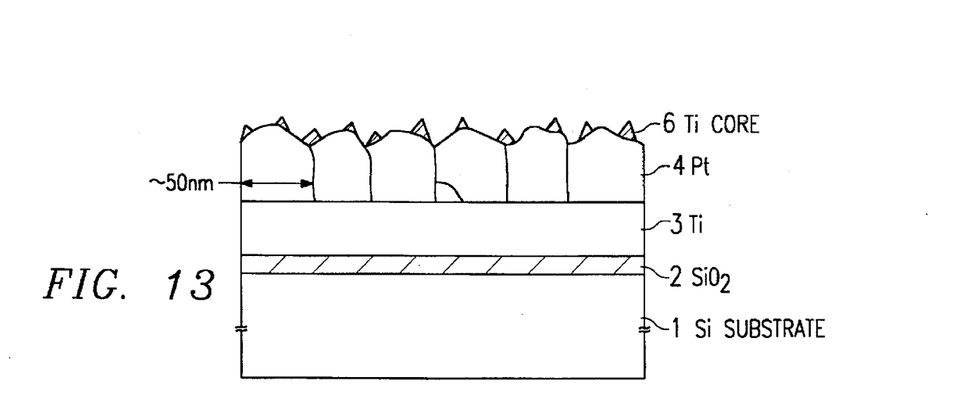
FIG. 13 is a cross section of an intermediate step for the ferroelectric BST capacitor film of another embodiment of the present invention.
Figure 14:
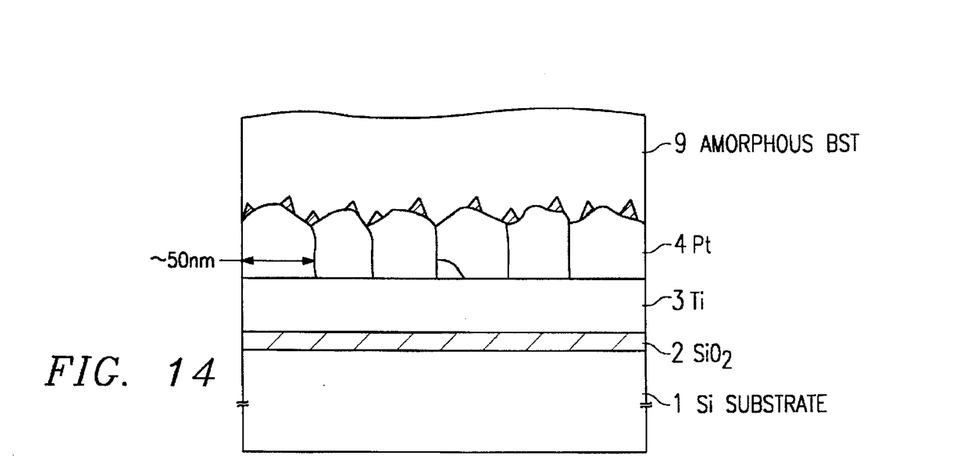
FIG. 14 is a cross section of an intermediate step for the ferroelectric BST capacitor film of another embodiment of the present invention.
Figure 15:
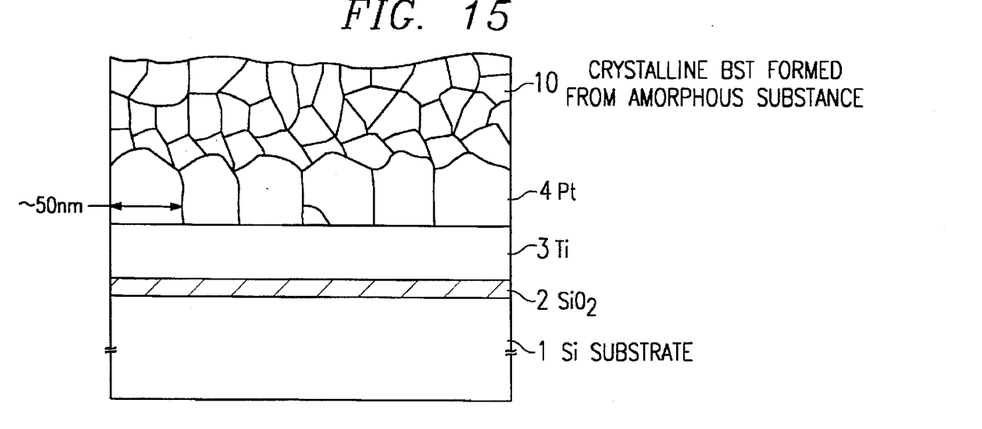
FIG. 15 is a cross section of the major components of the ferroelectric BST capacitor film of another embodiment of the present invention.

FIGS. 13 through 15 illustrate other embodiments. As in the foregoing embodiments, the structure illustrated in FIG. 13 is obtained when islands of the Ti film 6 are deposited to approximately 3 nm at 400° C. on the surface of the Pt film 4. This is the starting step for another embodiment of the present invention. More specifically, it is also possible to obtain the effect of reduced leakage current in the BST capacitors by forming the BST film from an amorphous substance.

In FIG. 14, the amorphous BST film 9 is formed to approximately 100 nm at 500° C. The BST film 9 is subjected to a heat treatment at 650° C. in an oxygen atmosphere to obtain a crystallized BST film 10. At this time the BST film 10 does not exhibit columnar growth and has a small crystal diameter. The islands of Ti then formed on the surface are absorbed by the second-layer BST film 10. As a result, a BST film with no columnar crystals forms part of the capacitors to reduce the leakage current as shown in FIG. 15.

Figure 16:
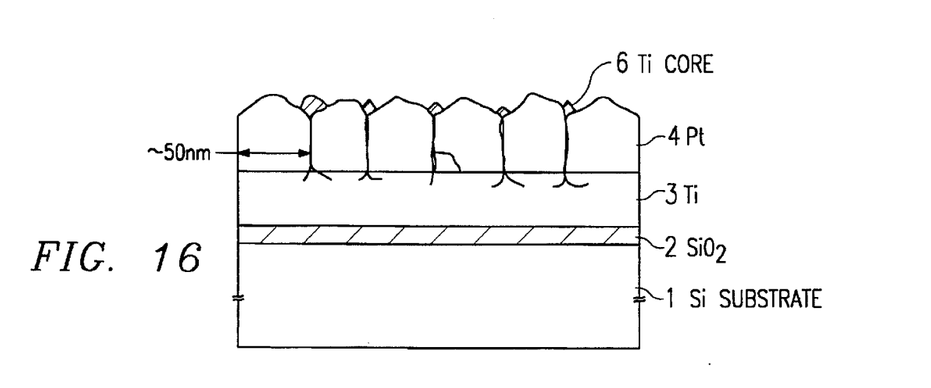
FIG. 16 is a cross section of the underlayer of the ferroelectric BST capacitor film of another embodiment of the present invention.
Figure 17:
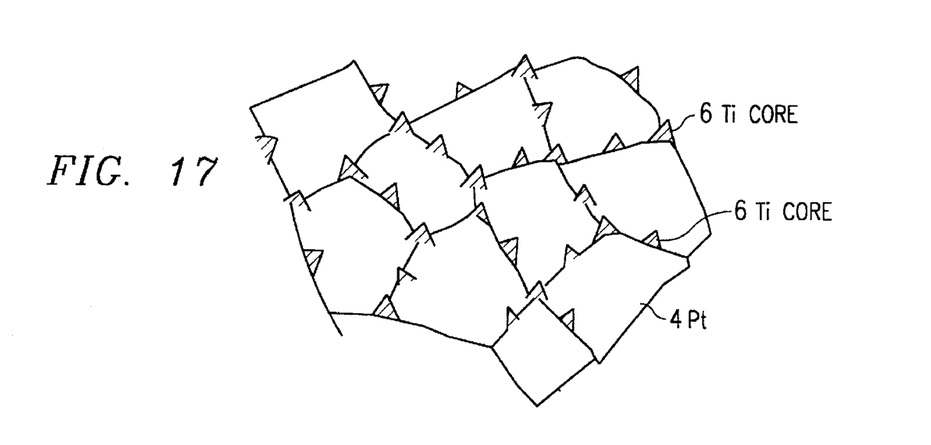
FIG. 17 is a cross section of the underlayer of the ferroelectric BST capacitor film of another embodiment of the present invention.

In all of the foregoing embodiments, the Ti 6 serving as the core for BST crystal growth was grown onto the surface of the Pt film 4. It is also permissible to form this utilizing grain boundary diffusion from the adhesive layer Ti or TiN, etc. underneath the Pt film 4. FIG. 16 illustrates this in cross section. FIG. 17 illustrates a Ti core formed on the surface of the adhesive layer of Pt 4. The Pt adhesive layer 4 is subjected to a heat treatment for 30 min in a nitrogen atmosphere at approximately 650° C. This extremely small region can be analyzed with a suitable tunneling electron microscope TEM to confirm the growth of the Ti cores 6 on the crystal grain boundaries of the Pt film 4. The methods described in reference to the foregoing embodiments can be used to form a BST film which will not create columnar crystals on this region. As a result, it is possible to form capacitors with minimal leakage current. It should be noted that when the Pt film 4 shown in FIG. 13 was subjected to a heat treatment in an oxygen atmosphere at 650° C. instead of using the Ti cores 6 of the present embodiment, titanium oxide grew on the crystal grain boundaries. When this was used as cores for BST film growth, it was possible to form an equivalent BST film. In addition, although the embodiments of the present invention have pertained to cases in which Ti or TiN is used as an adhesive layer permitting the formation of cores on the Pt crystal grain boundaries, it is also permissible to use Zr, Ir, etc. or oxides thereof, or conductive oxide films of $RuO_3$, $SnO_2$, etc., for the same effects.

Figure 18:
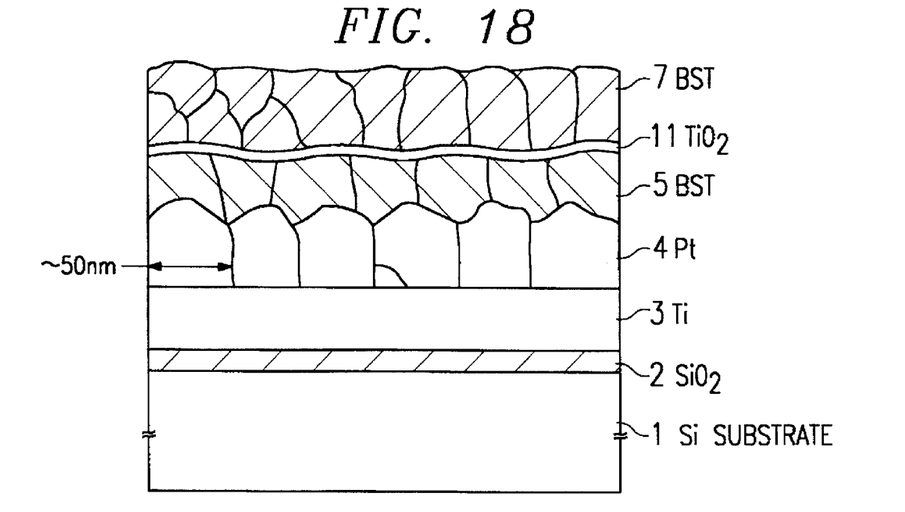
FIG. 18 is a cross section of the major components of the ferroelectric BST capacitor film of another embodiment of the present invention.

Yet another embodiment of the present invention will now be described. In this embodiment of the present invention, crystal growth from the underlayer is blocked to prevent the growth of columnar crystals, thereby making it possible to reduce the leakage current of the BST film. FIG. 18 is a cross section of the semiconductor devices of this embodiment. The Ti film 3 functioning as an adhesive layer is formed by sputtering to approximately 50 nm on the surface of the oxidized silicon substrate 1. Next, a Pt film 4 with a thickness of 200 nm is formed by sputtering. Next a BST film 5 is deposited to a thickness of approximately 100 nm in a mixed gas atmosphere of $O_2$ and Ar using a BST ceramic target. The substrate temperature during this process is maintained at approximately 650° C. to crystallize the BST film 5. Next, a titanium oxide $TiO_2$ film 11 is formed to an extremely small thickness of approximately 5 nm at 650° C. Next, the remaining BST film 7 is again deposited to a thickness of approximately 100 nm in a mixed gas atmosphere of $O_2$ and Ar. As a result, during the subsequent BST 7 formation step at 650° C., the $TiO_2$ film 11 is usually absorbed by the BST films 5 and 7 and thus does not appear to be present on the border between the films 5 and 7. In particular, the growth of columnar crystals in the ferroelectric film is suppressed, allowing circular crystal grains to form. This is effective in inhibiting the current flowing along the border. This film was used to form capacitors. An evaluation of the electrical characteristics indicated that the leakage current was significantly lower than that of the structure obtained with the conventional method. The benefits of this embodiment are much greater in terms of the reduction in leakage current than in relation to the voltage-current characteristics presented in the discussion of the foregoing embodiments.

In the foregoing embodiments, a $TiO_2$ film is formed during the BST formation process so that the formation of columnar crystals from the Pt substrate can be prevented. The Ti atoms in the $TiO_2$ film during this process are originally atoms contained in the BST film. Therefore, they are absorbed by the BST film during the subsequent high-temperature steps. For this reason, there is effectively no drop in the specific dielectric constant. Thus, the present invention has the same benefits regardless of whether the intermediate insertion film used during the BST formation step is a barium oxide film or strontium oxide film. It is also possible to use metal thin films consisting of Ba, Sr, Ti, etc. which are the metals forming BST.

In addition, ferroelectric materials other than BST are also applicable. More specifically, the ferroelectric thin film of the present invention may contain the following as structural elements:

etc. In addition, the insertion film serving to suppress the growth of columnar crystals in these films may also contain the [types of] atoms or oxides thereof which form these ferroelectrics.

Figure 19:
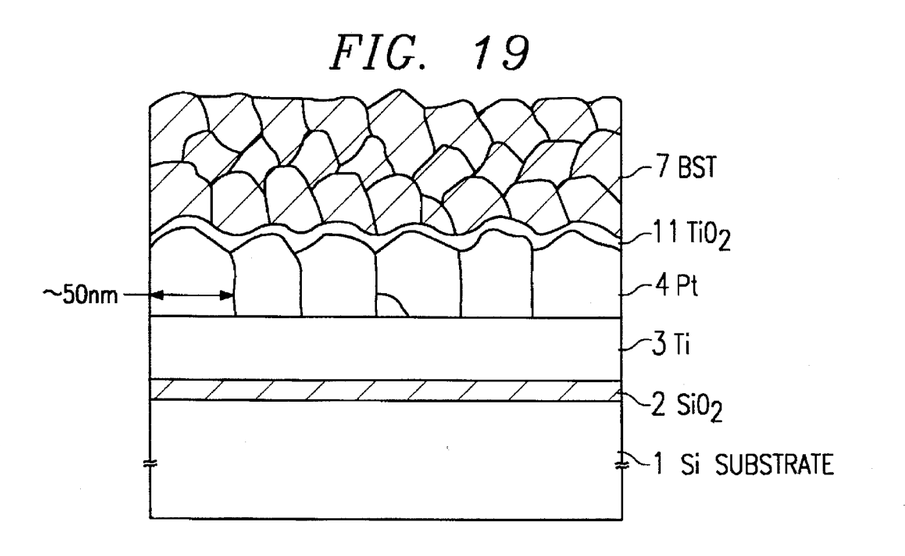
FIG. 19 is a cross section of the major components of the ferroelectric BST capacitor film of another embodiment of the present invention.

FIG. 19 illustrates another embodiment in which a $TiO_2$ insertion layer is used. Although the insertion layer 11 was introduced during the ferroelectric film formation process in the foregoing embodiments in order to suppress the growth of columnar crystals, it is also possible to obtain the same effects by introducing the insertion layer prior to the formation of the ferroelectric film. More specifically, the Ti film 3 functioning as an adhesive layer is formed by sputtering to approximately 50 nm on the surface of the oxidized silicon substrate 1. Next, a Pt film 4 with a thickness of 200 nm is formed by sputtering. Next, a titanium oxide film $TiO_2$ film 11 is formed to an extremely small thickness of approximately 5 nm at 650° C. Next, the remaining BST film 7 is again formed to a thickness of approximately 200 nm in a mixed gas atmosphere of $O_2$ and Ar using a BST ceramic target. The substrate temperature during this process is maintained at approximately 650° C. to crystallize the BST film 7, resulting in the structure shown in FIG. 19. In addition, the $TiO_2$ insertion layer 11 is absorbed by the BST film 7, thus effectively preventing any leakage current. The reduction in leakage current at this time is equivalent to that of the $TiO_2$ insertion layer 11 described above and is much greater than that of the conventional method.

In the embodiments presented above, islands of a Ti film or $TiO_2$ film 2 are formed either at the beginning of the BST formation process or during the process, thereby making it possible to suppress the formation of columnar crystals from the Pt substrate. The Ti atoms in the $TiO_2$ film during this process are originally atoms contained in the BST film. Therefore, they are absorbed by the BST film during the subsequent high-temperature steps. For this reason, there is effectively no drop in the specific dielectric constant. In addition, the present invention has the same benefits regardless of whether the intermediate insertion film used during the BST formation step is a barium oxide film or strontium oxide film. It is also possible to use metal thin films consisting of Ba, Sr, and Ti, which are the metals forming BST. It should be noted that although the embodiments of the present invention pertained to methods in which cores are formed by sputtering, for example, it is also permissible to use a sol-gel technique utilizing spin coating, thermal vapor deposition, or CVD. In particular, in cases where a sol-gel technique is used to form a ferroelectric thin film, heat treatment is often utilized to crystallize a normally amorphous ferroelectric. Obviously the benefits of the present invention in such cases are significant.

In addition, the operational effects of the present invention also apply to ferroelectric materials other than BST. More specifically, the ferroelectric thin film of the present invention may contain the following as structural elements:

etc. In addition, the insertion film serving to suppress the growth of columnar crystals in these films may also contain the [types of]atoms or oxides thereof which form these ferroelectrics.

The benefits obtained using representative examples of the inventions disclosed in this embodiment will now be described in brief.

A step is provided whereby a film consisting of a metal or oxide thereof, which contains structural elements of a metal forming the ferroelectric thin film, is formed in the initial stage of formation or during the formation of a ferroelectric thin film which normally forms columnar crystals. The formation of columnar crystals is suppressed, making it possible to form a capacitor dielectric with a small leakage current.

I claim:

1. A method for fabricating semiconductor devices containing a ferroelectric thin film, comprising the steps of:

providing a semiconductor substrate;

forming an insulating layer on the surface of the substrate;

forming a conductive adhesive layer on the insulating layer;

forming a lower electrode on the adhesive layer;

forming a first ferroelectric thin film on top of the lower electrode;

forming islands of a metal insertion substance on the crystal grain boundaries on the surface of the first ferroelectric thin film; and forming a second ferroelectric thin film on top of the islands of metal insertion substance and the first ferroelectric thin film.

2. The method of claim 1 wherein both of the materials forming the adhesive layer and the metal insertion substance are Ti or oxides of Ti.

3. The method of claim 1 wherein at least one of the ferroelectric thin films contains one or more of the following materials:

4. The method of claim 1 wherein both ferroelectric thin films contain one or more of the following materials:

5. A semiconductor fabrication method, comprising the steps of:

providing a semiconductor substrate;

forming an adhesive layer on the substrate;

forming a lower electrode on the adhesive layer;

forming a first ferroelectric thin film on top of the lower electrode;

forming a metal insertion substance layer on the first ferroelectric thin film;

forming a second ferroelectric thin film on the metal insertion substance layer; and causing the first and second ferroelectric thin films to absorb the metal insertion substance layer.

* * * * *